(12) United States Patent
Yamamoto

(10) Patent No.: US 8,374,207 B2
(45) Date of Patent: Feb. 12, 2013

(54) SEMICONDUCTOR LASER DEVICE

(75) Inventor: Takeshi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/560,563

(22) Filed: Sep. 16, 2009

(65) Prior Publication Data

US 2010/0074287 A1    Mar. 25, 2010

(30) Foreign Application Priority Data

Sep. 17, 2008  (JP) ................................ 2008-237549

(51) Int. Cl.
*H01S 5/022* (2006.01)
(52) U.S. Cl. ........ 372/43.01; 438/26; 257/678; 257/704
(58) Field of Classification Search ............... 372/43.01, 372/50.12–50.122; 438/26, 28; 257/678, 257/704
See application file for complete search history.

(56) References Cited

U.S. PATENT DOCUMENTS

| 7,075,178 | B2 | 7/2006 | Yamamoto |
| 2005/0195877 | A1 * | 9/2005 | Koizumi et al. ........... 372/43.01 |
| 2005/0286581 | A1 * | 12/2005 | Shinohara et al. ......... 372/43.01 |
| 2006/0292720 | A1 * | 12/2006 | Nishikawa ..................... 438/26 |

FOREIGN PATENT DOCUMENTS

| JP | 2008-21754 | 1/2008 |
| TW | 200516816 | 5/2005 |

* cited by examiner

*Primary Examiner* — Jessica Stultz
*Assistant Examiner* — Michael Carter
(74) *Attorney, Agent, or Firm* — Hamre, Schumann, Mueller & Larson, P.C.

(57) ABSTRACT

The present invention includes a semiconductor laser element, a lead, a first packaging member and a second packaging member. The lead includes a mount surface for supporting the semiconductor laser element. The first packaging member includes a first wall and a second wall. The first and the second walls are spaced from each other in a direction that is along the mount surface and crosses a laser beam emission direction of the semiconductor laser element, with the semiconductor laser element arranged between the first and the second walls. The second packaging member is pressed in between the first and the second walls and faces the mount surface and the semiconductor laser element.

17 Claims, 6 Drawing Sheets

SEMICONDUCTOR LASER DEVICE

BACKGROUND OF THE INVENTION

1. Field of the Invention

The present invention relates to a semiconductor laser device to be incorporated in e.g. an optical pickup device for performing reading or recording with respect to an optical recording medium.

2. Description of the Related Art

FIG. 8 is a plan view illustrating a semiconductor laser device A3 as an example of conventional semiconductor laser device. The semiconductor laser device A3 includes a lead 91, a semiconductor laser chip 92 for emitting a laser beam L and a resin portion 93. The lead 91 includes a mount portion 91a and terminal portions 91b. The semiconductor laser chip 92 is mounted to the mount portion 91a via a submount 94 and electrically connected to the terminal portions 91b via wires 95. The resin portion 93 holds the mount portion 91a and the terminal portions 91b of the lead 91. This type of conventional semiconductor laser device is disclosed in JP-A-2008-21754, for example.

In the process to incorporate the semiconductor laser device A3 in e.g. an optical pickup device, a worker handles the semiconductor laser device A3 with a handling tool such as tweezers. In this incorporation process, the handling tool may come into contact with the semiconductor laser chip 92 to damage the semiconductor laser chip. This is because, in the semiconductor laser device A3, the semiconductor laser chip 92 on the mount portion 91a is exposed on the side opposite the mount portion 91a.

The present invention has been proposed under the circumstances described above. It is therefore an object of the present invention to provide a semiconductor laser device which is capable of protecting the semiconductor laser element properly.

SUMMARY OF THE INVENTION

According to the present invention, there is provided a semiconductor laser device including a semiconductor laser element which is capable of emitting a laser beam, a lead, a first packaging member and a second packaging member. The lead includes amount surface for supporting the semiconductor laser element. The first packaging member includes a first wall and a second wall. The first wall and the second wall are spaced from each other in a direction that is along the mount surface and crosses the laser beam emission direction of the semiconductor laser element, with the semiconductor laser element arranged between the first and the second walls. The second packaging member is pressed in between the first and the second walls and faces the mount surface and the semiconductor laser element.

Preferably, each of the first and the second walls includes a stopper portion for preventing the second packaging member from approaching the semiconductor laser element. Preferably, the second packaging member includes a recess facing the semiconductor laser element.

In a preferred embodiment, the first packaging member includes a fitting receiving portion. The fitting receiving portion is defined between a first recess formed in a second wall side of the first wall and a second recess formed in the second wall to face the first recess. The second packaging member includes a fitting insertion portion. The fitting insertion portion is a portion from a first projection to a second projection. The first projection is formed at the second packaging member at a position corresponding to the first recess. The second projection is formed at the second packaging member at a position corresponding to the second recess. The fitting insertion portion of the second packaging member is pressed into the fitting receiving portion of the first packaging member. Preferably, each of the first and the second walls includes a stopper portion for preventing the second packaging member from approaching the semiconductor laser element. In this case, it is preferable that the stopper portion of the first wall is in contact with the first projection, whereas the stopper portion of the second wall is in contact with the second projection.

In another preferred embodiment, the first packaging member includes a plurality of fitting receiving portions. Each of the fitting receiving portions is defined between a first recess formed in a second wall side of the first wall and a second recess formed in the second wall to face the first recess. The second packaging member includes a plurality of fitting insertion portions. Each of the fitting insertion portions is a portion from a first projection to a second projection. The first projection is formed at the second packaging member at a position corresponding to the first recess of one of the fitting receiving portions. The second projection is formed at the second packaging member at a position corresponding to the second recess of the one of the fitting receiving portions. Each of the fitting insertion portions of the second packaging member is pressed into a corresponding one of the fitting receiving portions of the first packaging member. Preferably, each of the first and the second walls includes a stopper portion for preventing the second packaging member from approaching the semiconductor laser element. In this case, it is preferable that the stopper portion of the first wall is in contact with the first projections, whereas the stopper portion of the second wall is in contact with the second projections. In this case, it is preferable that the stopper portion of the first wall is in contact with an edge of the second packaging member between adjacent two of the first projections, whereas the stopper portion of the second wall is in contact with an edge of the second packaging member between adjacent two of the second projections. Further, part of the first wall may be pressed in between adjacent two of the first projections, whereas part of the second wall may be pressed in between adjacent two of the second projections.

In another preferred embodiment, the first packaging member includes two fitting receiving portions. Each of the fitting receiving portions is defined between a first recess formed in a second wall side of the first wall and a second recess formed in the second wall to face the first recess. The second packaging member includes two fitting insertion portions. Each of the fitting insertion portions is a portion from a first projection to a second projection. The first projection is formed at the second packaging member at a position corresponding to the first recess of one of the fitting receiving portions. The second projection is formed at the second packaging member at a position corresponding to the second recess of the one of the fitting receiving portions. Each of the fitting insertion portions of the second packaging member is pressed into a corresponding one of the fitting receiving portions of the first packaging member. The first recess of each of the fitting receiving portions includes a first surface held in contact with the first projection to apply a pressing force to the first projection. The second recess of each of the fitting receiving portions includes a second surface held in contact with the second projection to apply a pressing force to the second projection. The two first surfaces of the first recesses are so inclined that the distance between the two first surfaces gradually reduces as proceeding away from the second wall. The two second surfaces of the second recesses are so inclined that distance between the two second surfaces gradually reduces as proceeding away from the first wall. Preferably, each of the first and the second walls includes a stopper portion for preventing the second packaging member from approaching the semiconductor laser element. In this case, it is preferable that the stopper portion of the first wall is in contact with the first projections, whereas the stopper portion of the second wall is in contact with the second projections. In this case, it is preferable that the stopper portion of the first wall is in contact with an edge of the second packaging member between the two first projections, whereas the stopper portion of the second wall is in contact with an edge of the second packaging member between the two second projections. Further, part of the first wall may be pressed in between the two first projections, whereas part of the second wall may be pressed in between the two second projections.

DETAILED DESCRIPTION OF THE PREFERRED EMBODIMENTS

Figure 1:
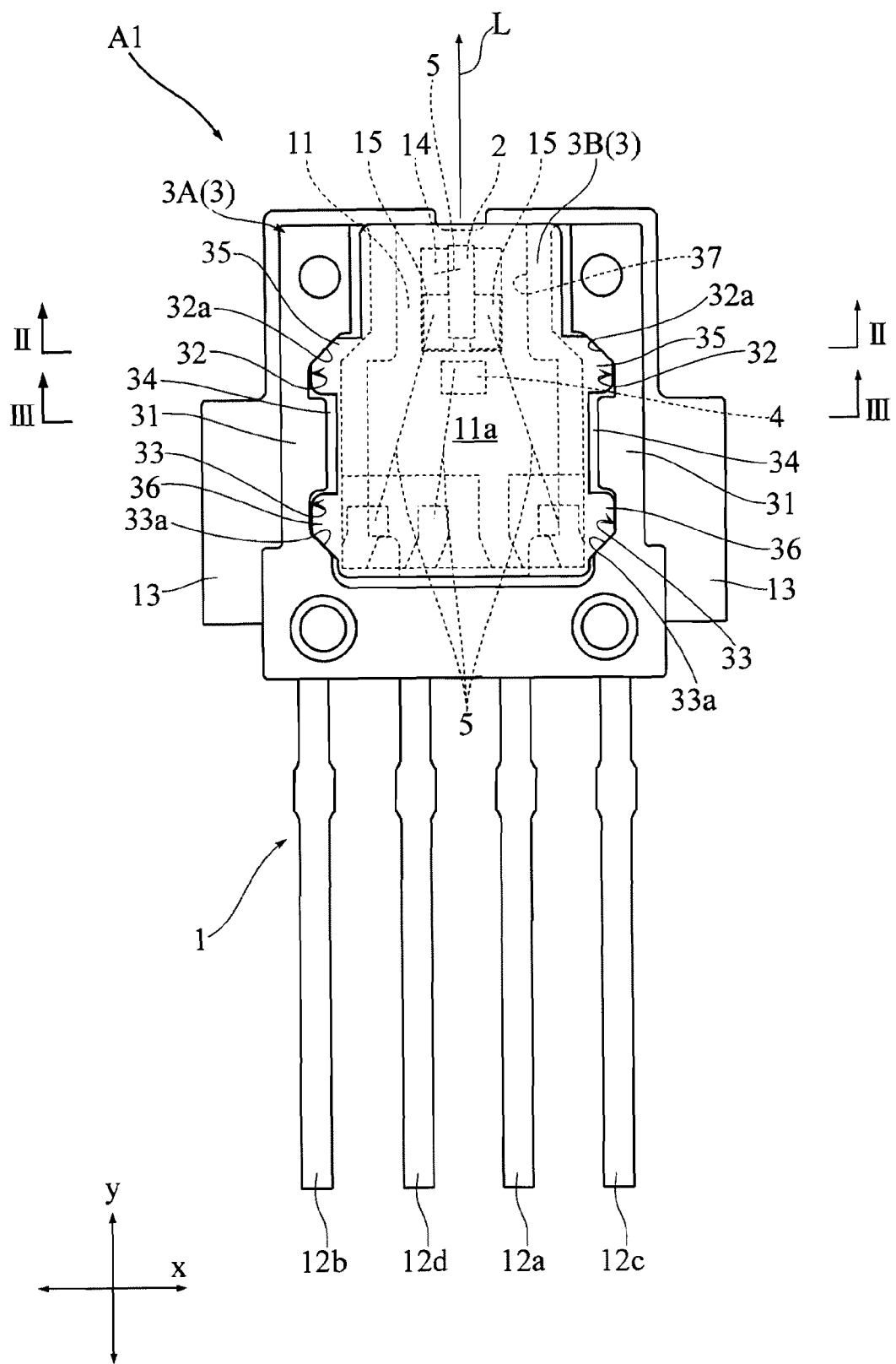
FIG. 1 is a plan view illustrating a semiconductor laser device according to a first embodiment of the present invention.
Figure 2:
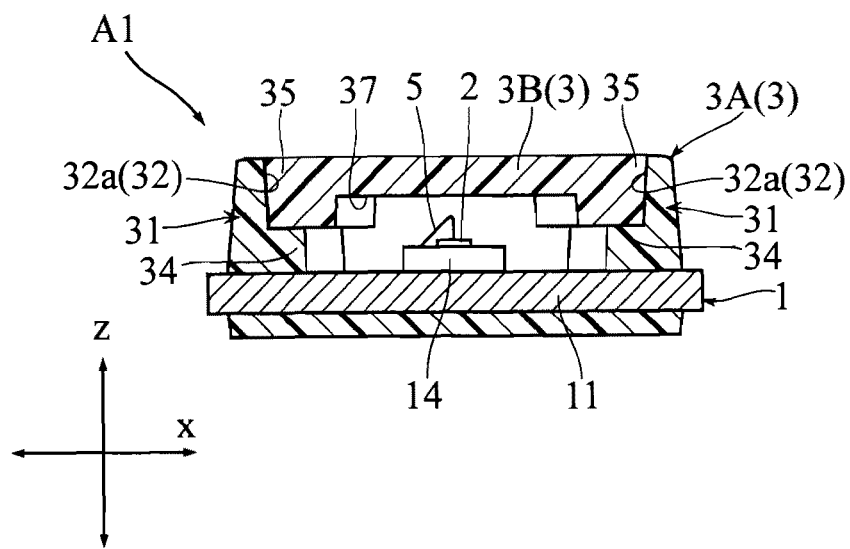
FIG. 2 is a sectional view taken along lines II-II in FIG. 1.
Figure 3:
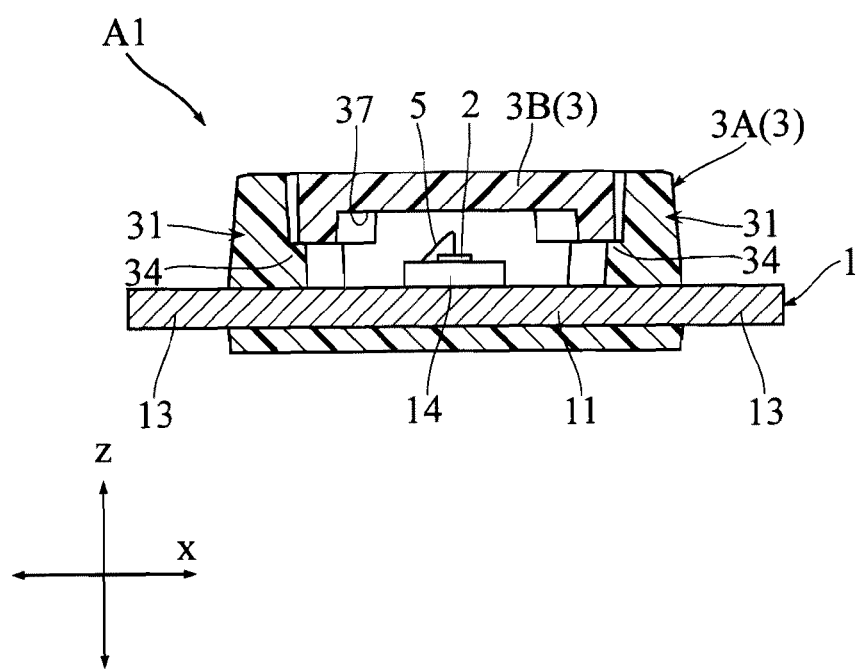
FIG. 3 is a sectional view taken along lines III-III in FIG. 1.

FIGS. 1-3 illustrate a semiconductor laser device A1 according to a first embodiment of the present invention. The semiconductor laser device A1 includes a lead 1, a semiconductor laser chip 2, a resin package 3 and a light receiving element 4 (not illustrated in FIG. 3). The semiconductor laser device A1 is incorporated in e.g. an optical pickup device for performing reading or recording with respect to an optical recording medium.

The lead 1 is made of e.g. Cu alloy. The lead 1 is to support the semiconductor laser chip 2 and constitutes part of the electrical conduction path between the semiconductor laser chip 2 and a power supply circuit of the optical pickup device. The lead 1 includes a mount portion 11, terminal portions 12a, 12b, 12c, 12d and a pair of projecting portions 13. In this embodiment, the lead 1 has a thickness of 0.3 mm.

The mount portion 11 includes a mount surface 11a and is substantially rectangular in plan view of FIG. 1. The mount portion 11 forms a relatively large fraction of the lead 1. On the mount portion 11, the semiconductor laser chip 2 is mounted.

Each of the terminal portions 12a-12d serves as an external connection terminal of the semiconductor laser device A1 for connection to a terminal of an optical pickup device. The terminal portion 12a extends from the mount portion 11 and functions as a common lead. The terminal portions 12b-12d are separated from the mount portion 11. The terminal portions 12b and 12c function as power supply terminals for the semiconductor laser chip 2. The terminal portion 12d functions as a terminal for outputting current from the light receiving element 4. Each of the terminal portions 12a-12d includes a portion projecting from the resin package 3 and extending in the y direction.

As illustrated in FIGS. 1 and 3, the paired projecting portions 13 extend from edges of the mount portion 11 in opposite directions to be positioned outside the resin package 3. The projecting portions 13 may be used to properly position the semiconductor laser device A1 in an optical pickup device. In this embodiment, the dimension between the respective outer ends of the paired projecting portions 13 in the x direction is 5.2 mm.

The semiconductor laser chip 2, which is the light source of the semiconductor laser device A1, is made of e.g. GaAs and capable of emitting a laser beam L in the y direction. The semiconductor laser chip 2 is capable of emitting a laser beam also toward the light receiving element 4 in the y direction. The laser beam toward the light receiving element 4 serves as a monitoring laser beam. In this embodiment, the semiconductor laser chip 2 is a dual-wavelength semiconductor laser chip in which two semiconductor laser elements, which are capable of emitting laser beams L of different wavelengths, are formed monolithically and integrally. The terminal portion 12b is electrically connected to one of the semiconductor laser elements, whereas the terminal portion 12c is electrically connected to the other one of the semiconductor laser elements. The semiconductor laser chip 2 is mounted on the mount portion 11 or the mount surface 11a of the lead 1 via the submount 14. The submount 14 is made of e.g. AlN or Si and serves to virtually alleviate the thermal expansion difference between the mount portion 11 and the semiconductor laser chip 2. As illustrated in FIG. 1, the submount 14 is provided with two pads 15. The two pads 15 are electrically connected to the two semiconductor laser elements incorporated in the semiconductor laser chip 2, respectively, and connected to the terminal portions 12b and 12c via wires 5. In this embodiment, the submount 14 may not be provided, and the semiconductor laser chip 2 may be mounted directly on the mount portion 11 or the mount surface 11a.

The light receiving element 4 is utilized for monitoring the light emission state of the semiconductor laser chip 2 and mounted on the mount portion 11. The light receiving element 4 is connected to the terminal portion 12d via a wire 5.

The resin package 3 is provided to protect the semiconductor laser chip 2 and made of e.g. a thermoplastic resin such as polyphenylene sulfide (PPS) resin. The resin package 3 includes a main portion 3A and a cover 3B and is formed with an opening for allowing the laser beam L to be emitted to the outside of the device. In this embodiment, the resin package 3 has a dimension of 4.0 mm in the x direction, a dimension of 4.5 mm in the y direction and a thickness of 1.4 mm.

The main portion 3A is a first packaging member of the present invention and includes a pair of side walls 31. The side walls 31 are spaced from each other in the x direction (i.e., the direction which is along the mount portion 11 and perpendicular to the laser beam emitting direction of the semiconductor laser chip 2), with the semiconductor laser chip 2 arranged between the side walls. As illustrated in FIG. 1, each of the side walls 31 is formed with a recess 32 and a recess 33. Further, as illustrated in FIGS. 2 and 3, the side wall 31 includes a stopper portion 34. In this embodiment, the distance between the paired side walls 31 is 2.2 mm, and the depth of each of the recesses 32 and 33 in the x direction is about 0.25 mm.

The two recesses 32 of the paired side walls 31 are spaced from each other and face each other in the x direction. Each of the recesses 32 includes a receiving surface 32a. Between the two recesses 32, a fitting receiving portion is defined. The two recesses 33 of the paired side walls 31 are spaced from each other and face each other in the x direction. Each of the recesses 33 includes a receiving surface 33a. Between the two recesses 33, another fitting receiving portion is defined. The two fitting receiving portions are spaced from each other in the y direction.

The receiving surfaces 32a and 33a of the recesses 32 and 33 are inclined with respect to both of the x direction and the y direction. Specifically, the two receiving surfaces 32a and 33a of the recesses 32 and 33 of each side wall 31 are so inclined that the distance between the receiving surfaces 32a and 33a gradually reduces as proceeding away from the other side wall 31.

The stopper portions 34 prevent the cover 3B from approaching too close to the semiconductor laser chip 2 and the wires 5 in the z direction.

The cover 3B is a second packaging member of the present invention and pressed in between the side walls 31. The cover 3B faces the mount portion 11 and the semiconductor laser chip 2. As illustrated in FIGS. 1-3, the cover 3B includes a pair of projections 35, a pair of projections 36 and a recess 37.

The paired projections 35 project in opposite directions from each other. Each of the projections 35 is provided at a position corresponding to the recess 32 of a respective one of the side walls 31. The portion from one of the projections 35 to the other one of the projections 35 forms a fitting insertion portion. The paired projections 36 project in opposite directions from each other. Each of the projections 36 is provided at a position corresponding to the recess 33 of a respective one of the side walls 31. The portion from one of the projections 36 to the other one of the projections 36 forms another fitting insertion portion. The two fitting insertion portions are spaced from each other in the y direction. In this embodiment, the cover 3B has a thickness of 5.5 mm, a dimension of 3.45 mm in the y direction and a dimension of 2.5mm in the x direction excluding the projections 35 and 36. The projections 35 and 36 have a dimension of 0.5 mm in the x direction.

Each of the fitting insertion portions of the cover 3B is pressed into a corresponding one of the fitting receiving portions of the main portion 3A. Each of the projections 35 is pressed against the receiving surface 32a of a corresponding one of the recesses 32. That is, each receiving surface 32a is in contact with the corresponding projection 35 while applying a pressing force to the projection 35. Each of the projections 36 is pressed against the receiving surface 33a of a corresponding one of the recesses 33. That is, each receiving surface 33a is in contact with the corresponding projection 36 while applying a pressing force to the projection 36. The four receiving surfaces 32a, 33a in total apply a pressing force to the cover 3B in both of the X direction and the y direction as a whole.

The stopper portions 34 prevent the cover 3B, which is pressed into the main portion 3A, from further entering the semiconductor laser chip 2 side. As illustrated in FIGS. 1 and 2, the stopper portions 34 are in contact with the projections 35 and 36 of the cover 3B. Further, as illustrated in FIGS. 1 and 3, the stopper portions 34 are also in contact with the edges of the cover 3B between two adjacent projections 35 and 36.

As illustrated in FIGS. 1-3, the recess 37 of the cover 3B is provided to face the entire semiconductor laser chip 2.

Figure 4:
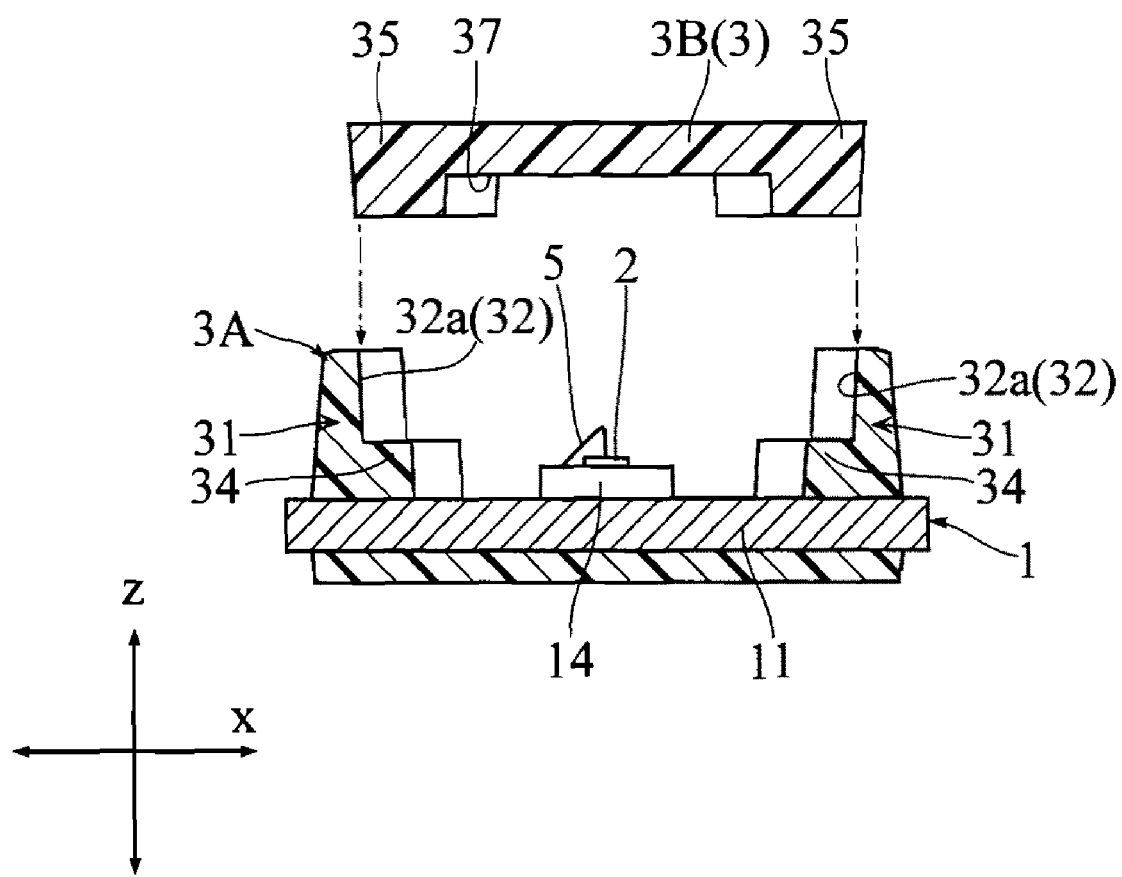
FIG. 4 illustrates a step of pressing a cover in between walls in a process for manufacturing the semiconductor laser device illustrated in FIG. 1.

In the process for manufacturing the semiconductor laser device A1, a pressing step is performed as illustrated in FIG. 4. In the pressing step, each of the fitting insertion portions of the cover 3B is pressed in a corresponding one of the fitting receiving portions of the main portion 3A, which is formed in advance to cover part of the lead 1.

In the process to incorporate the semiconductor laser device A1 in an optical pickup device, a worker handles the semiconductor laser device A1 with a handling tool such as tweezers. With the semiconductor laser device A1, the contact of the handling tool with the semiconductor laser chip 2 and the resulting damage to the semiconductor laser chip in the incorporation process are prevented. This is because, as better illustrated in FIGS. 2 and 3, the semiconductor laser chip 2 of the semiconductor laser device A1 is surrounded by the mount portion 11 of the lead 1, the main portion 3A or paired side walls 31 of the resin package 3, and the cover 3B of the resin package 3. Moreover, with the semiconductor laser device Al, the contact of the handling tool with wires 5 and the resulting damage to the wires 5 in the incorporation process are also prevented. This is because, similarly to the semiconductor laser chip 2, the wires 5 are also surrounded by the mount portion 11 of the lead 1, the paired side walls 31 and the cover 3B.

Since the cover 3B is pressed in between the side walls 31 in the semiconductor laser device A1, the cover 3B does not easily become detached from the main portion 3A.

In the semiconductor laser device A1, the cover 3B does not easily shift from the proper position relative to the paired side walls 31, because the paired projections 35 and the paired projections 36 of the cover 3B are received in the corresponding recesses 32 and 33 of the main portion 3A to fulfill a position fixing function.

As noted before, in the semiconductor laser device A1, the four receiving surfaces 32a, 33a in total apply a pressing force to the cover 3B in both of the X direction and the y direction as a whole. This arrangement is desirable for achieving correct positioning of the cover 3B.

In the semiconductor laser device A1, the overall dimension in the y direction is easily set small. This is because the paired side walls 31, between which the cover 3B is to be pressed in, are spaced from each other in the x direction perpendicular to the y direction. To provide a sufficient strength, the paired side walls 31, between which the cover 3B is to be pressed in, need to have a sufficient thickness in the spacing direction. When the side walls 31 are arranged to be spaced from each other in the y direction (laser beam emission direction), it is difficult to set the dimension in the y direction small. However, since the paired side walls 31 are spaced from each other in the x direction in the semiconductor laser device A1, the overall dimension in the y direction is easily set small. Since the semiconductor laser device A1 has an overall shape elongated in the y direction, to set the overall dimension in the y direction small is effective for the size reduction of the semiconductor laser device A1. The size reduction of a semiconductor laser device is desirable for the size reduction of an optical pickup device into which the semiconductor laser device is incorporated.

As noted before, in the semiconductor laser device A1, the stopper portions 34 prevent the cover 3B, which is pressed into the main portion 3A, from further entering the semiconductor laser chip 2 side. With this arrangement, in e.g. pressing the cover 3B in between the side walls 31 in the above-described pressing step, the semiconductor laser chip 2 and the wires 5 are prevented from being crushed by the cover 3B.

In the semiconductor laser device A1, as illustrated in FIGS. 1 and 3, the stopper portions 34 are in contact with the edges of the cover 3B between two adjacent projections 35 and 36. With this arrangement, the burr separated from the cover 3B in the pressing step is prevented from scattering toward the semiconductor laser chip 2.

As noted before, in the semiconductor laser device A1, the cover 3B facing the mount portion 11 and the semiconductor laser chip 2 includes the recess 37 facing the semiconductor laser chip 2. This arrangement is suitable for preventing the semiconductor laser chip 2 and the wires 5 from coming into contact with the cover 3B.

Figure 5:
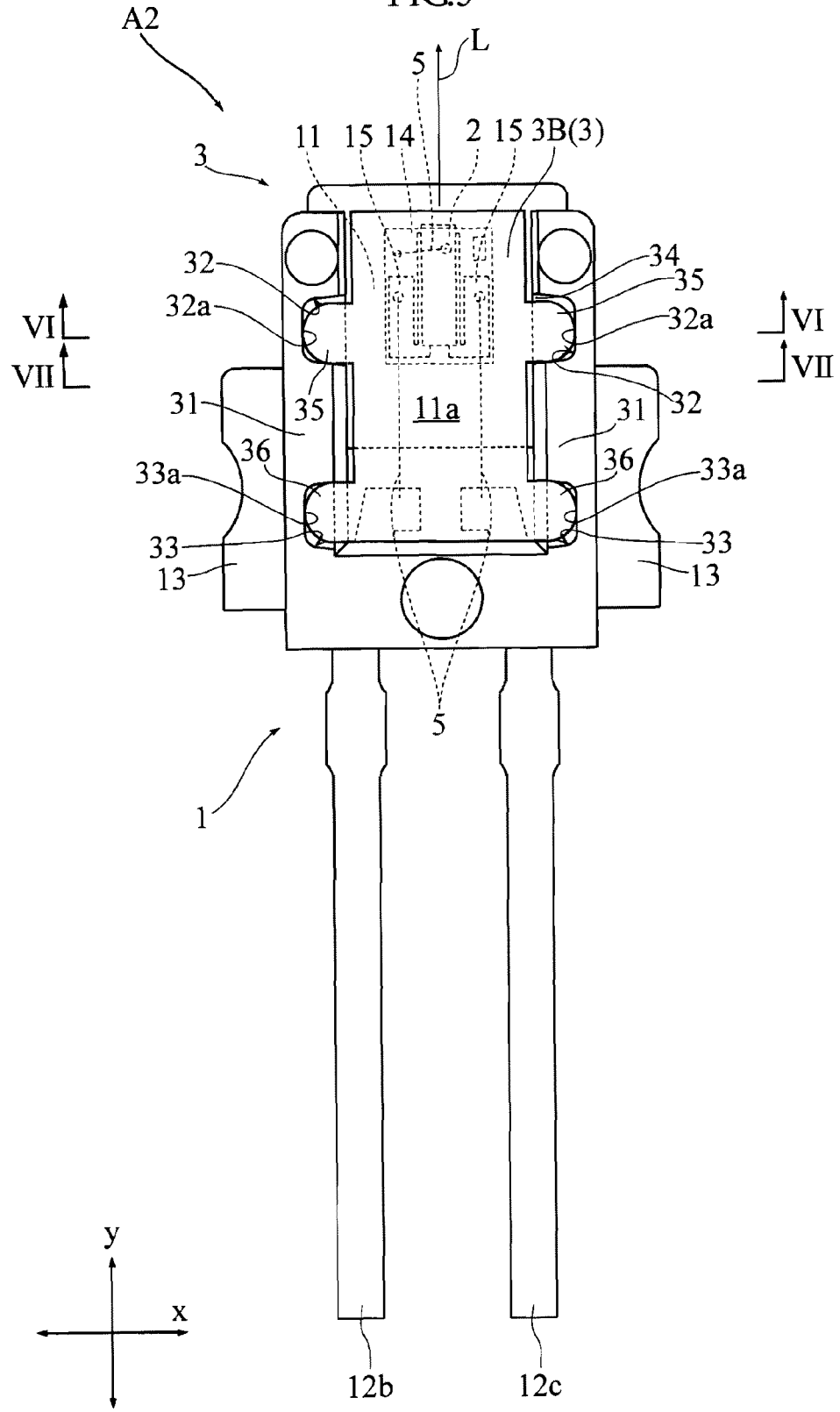
FIG. 5 is a plan view illustrating a semiconductor laser device according to a second embodiment of the present invention.
Figure 6:
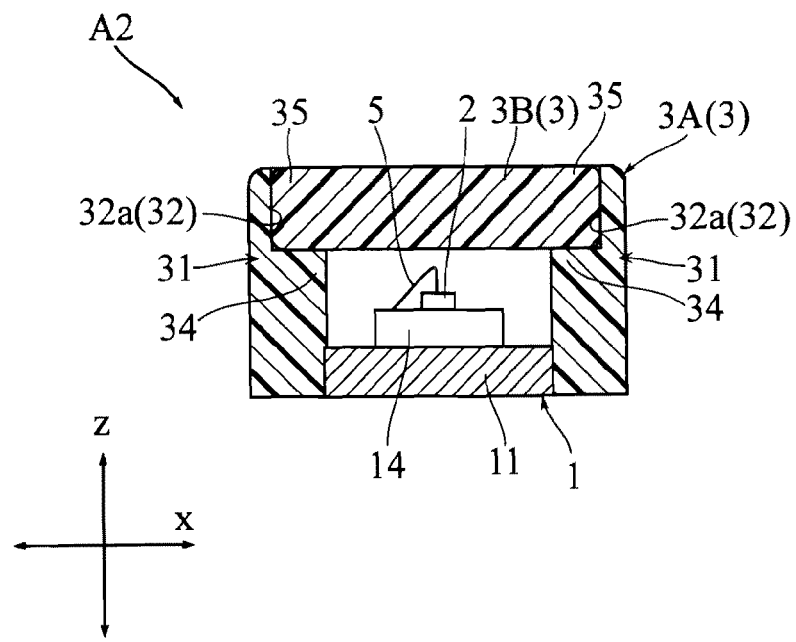
FIG. 6 is a sectional view taken along lines VI-VI in FIG. 5.
Figure 7:
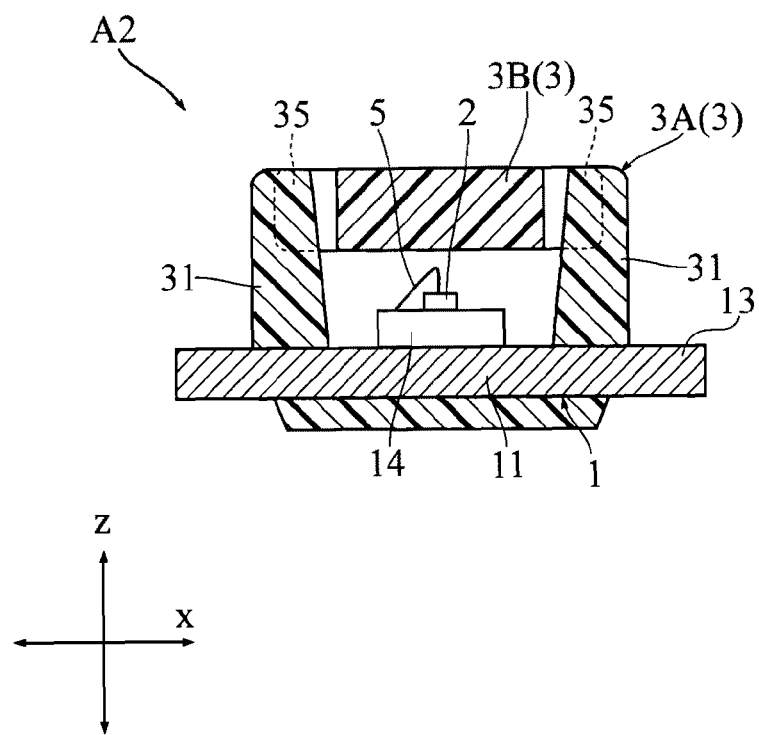
FIG. 7 is a sectional view taken along lines VII-VII in FIG. 5.
Figure 8:
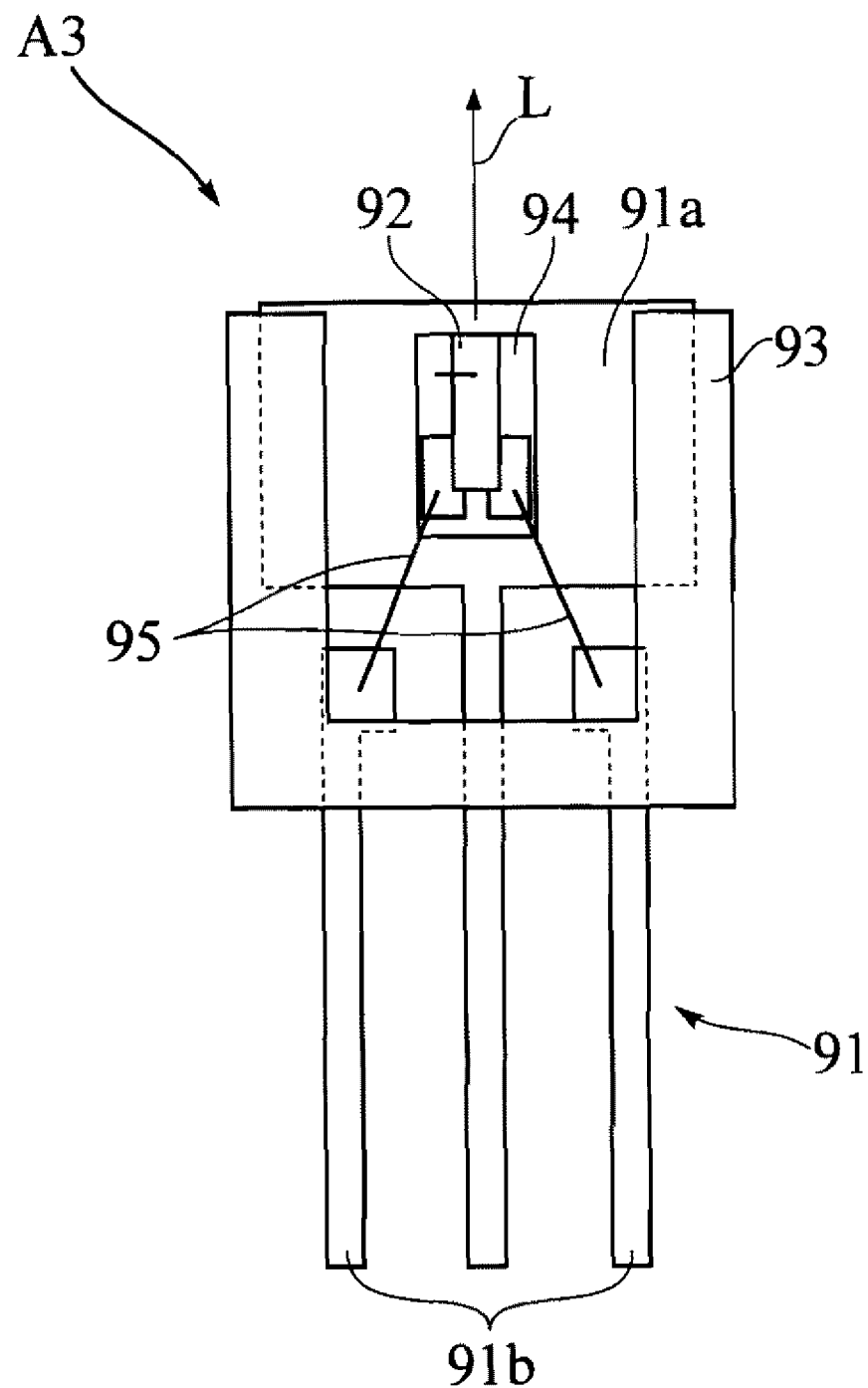
FIG. 8 is a plan view illustrating a conventional semiconductor laser device.

FIGS. 5-7 illustrate a semiconductor laser device A2 according to a second embodiment of the present invention. In FIGS. 5-7, the elements which are identical or similar to those of the first embodiment are designated by the same reference signs as those used for the first embodiment.

The semiconductor laser device A2 includes a lead 1, a semiconductor laser chip 2 and a resin package 3. The semiconductor laser device A2 is used as incorporated in e.g. an optical pickup device for performing reading or recording with respect to an optical recording medium. The semiconductor laser device A2 differs from the foregoing semiconductor laser device A1 in the structure of the lead 1, the conduction path to the semiconductor laser chip 2 and the structure of the resin package 3. The semiconductor laser device A2 does not include a light receiving element 4.

The lead 1 is made of e.g. Cu alloy and includes a mount portion 11, terminal portions 12b, 12c, and a pair of projecting portions 13. The mount portion 11 includes a mount surface 11a. On the mount portion 11 or the mount surface 11a, the semiconductor laser chip 2 is mounted. The terminal portions 12b and 12c function as power supply terminals for the semiconductor laser chip 2 and are separated from the mount portion 11. Each of the terminal portions 12b and 12c includes a portion projecting from the resin package 3 and extending in the y direction.

As illustrated in FIGS. 5 and 7, the paired projecting portions 13 extend from edges of the mount portion 11 in opposite directions to be positioned outside the resin package 3. The projecting portions 13 may be used to properly position the semiconductor laser device A2 in an optical pickup device. The projecting portions 13 are electrically connected to the semiconductor laser chip 2 via a submount 14 and a wire 5. The projecting portions 13 also function as a power supply terminal for the semiconductor laser chip 2. When the semiconductor laser device A2 is incorporated in an optical pickup device, the terminal portions 12b, 12c and the paired projecting portions 13 of the lead 1 are connected, as external connection terminals of the semiconductor laser device A2, to terminals of the optical pickup device. In this embodiment, the dimension between the respective outer ends of the paired projecting portions 13 in the x direction is 3.3 mm.

The semiconductor laser chip 2 is designed as a dual-wavelength semiconductor laser chip incorporating two semiconductor laser elements. As illustrated in FIG. 5, the semiconductor laser chip is electrically connected to the two terminal portions 12b and 12c via two wires 5 and two pads 15 on the submount 14.

The resin package 3 includes a main portion 3A and a cover 3B and is formed with an opening for allowing a laser beam L to be emitted to the outside of the device. In this embodiment, the resin package 3 has a dimension of 2.35 mm in the x direction, a dimension of 3.15 mm in the y direction and a thickness of 1.6 mm.

The main portion 3A is a first packaging member of the present invention and includes a pair of side walls 31. The side walls 31 are spaced from each other in the x direction, with the semiconductor laser chip 2 arranged between the side walls. As illustrated in FIG. 5, each of the side walls 31 is formed with a recess 32 and a recess 33. Further, as illustrated in e.g. FIG. 6, the side wall 31 includes a stopper portion 34.

The two recesses 32 of the paired side walls 31 are spaced from each other and face each other in the x direction. Each of the recesses 32 includes a receiving surface 32a. In this embodiment, the receiving surface 32a is perpendicular to the x direction. Between the two recesses 32, a fitting receiving portion is defined. The two recesses 33 of the paired side walls 31 are spaced from each other and face each other in the x direction. Each of the recesses 33 includes a receiving surface 33a. In this embodiment, the receiving surface 33a is perpendicular to the x direction. Between the two recesses 33, another fitting receiving portion is defined. The two fitting receiving portions are spaced from each other in the y direction.

The stopper portions 34 prevent the cover 3B from approaching too close to the semiconductor laser chip 2 and the wires 5 in the z direction.

The cover 3B is a second packaging member of the present invention and pressed in between the side walls 31. The cover 3B faces the mount portion 11 and the semiconductor laser chip 2. As illustrated in FIGS. 5-7, the cover 3B includes a pair of projections 35 and a pair of projections 36.

The paired projections 35 project in opposite directions from each other. Each of the projections 35 is provided at a position corresponding to the recess 32 of a respective one of the side walls 31. The portion from one of the projections 35 to the other one of the projections 35 forms a fitting insertion portion. The paired projections 36 project in opposite directions from each other. Each of the projections 36 is provided at a position corresponding to the recess 33 of a respective one of the side walls 31. The portion from one of the projections 36 to the other one of the projections 36 forms another fitting insertion portion. The two fitting insertion portions are spaced from each other in the y direction.

Each of the fitting insertion portions of the cover 3B is pressed into a corresponding one of the fitting receiving portions of the main portion 3A. Each of the projections 35 is pressed against the receiving surface 32a of a corresponding one of the recesses 32. That is, each receiving surface 32a is in contact with the corresponding projection 35 while applying a pressing force to the projection 35. Each of the projections 36 is pressed against the receiving surface 33a of a corresponding one of the recesses 33. That is, each receiving surface 33a is in contact with the corresponding projection 36 while applying a pressing force to the projection 36. Further, as illustrated in FIG. 5, part of each side wall 31 is pressed in between the projections 35 and 36 which are in contact with the side wall 31.

The stopper portions 34 prevent the cover 3B, which is pressed into the main portion 3A, from further entering the semiconductor laser chip 2 side. As illustrated in FIGS. 5 and 6, the stopper portions 34 are in contact with the projections 35 and 36 of the cover 3B.

In the process for manufacturing the semiconductor laser device A2, a pressing step is performed, which is similar to that in the manufacturing process of the semiconductor laser device A1 described with reference to FIG. 4.

With the semiconductor laser device A2, the contact of a handling tool with the semiconductor laser chip 2 and the resulting damage to the semiconductor laser chip are prevented in the incorporation process into an optical pickup device. This is because, as illustrated in FIGS. 5 and 6, the semiconductor laser chip 2 of the semiconductor laser device A2 is surrounded by the mount portion 11 of the lead 1, the main portion 3A or paired side walls 31 of the resin package 3, and the cover 3B of the resin package 3. Moreover, with the semiconductor laser device A2, the contact of the handling tool with wires 5 and the resulting damage to the wires 5 in the incorporation process are also prevented. This is because, similarly to the semiconductor laser chip 2, the wires 5 are also surrounded by the mount portion 11 of the lead 1, the paired side walls 31 and the cover 3B.

In the semiconductor laser device A2, the cover 3B is pressed in between the paired side walls 31, and part of each side wall 31 is pressed in between the projections 35 and 36 which are in contact with the side wall 31. Since such strong press-in state is provided between the main portion 3A and the cover 3B, the cover 3B does not easily become detached from the main portion 3A. Further, the arrangement in which part of each side wall 31 is pressed in between the projections 35 and 36 which are in contact with the side wall 31 is desirable for achieving correct positioning of the cover 3B.

In the semiconductor laser device A2, the cover 3B does not easily shift from the proper position relative to the side walls 31, because the paired projections 35 and the paired projections 36 of the cover 3B are received in the corresponding recesses 32 and 33 of the main portion 3A to fulfill a position fixing function.

In the semiconductor laser device A2, similarly to the semiconductor laser device A1, the overall dimension in the y direction is easily set small. This is because, in the semiconductor laser device A2, similarly to the semiconductor laser device A1, the paired side walls 31, between which the cover 3B is to be pressed in, are spaced from each other in the x direction perpendicular to the y direction.

As noted before, in the semiconductor laser device A2, the stopper portions 34 prevent the cover 3B, which is pressed into the main portion 3A, from further entering the semiconductor laser chip 2 side. With this arrangement, in e.g. pressing the cover 3B in between the side walls 31 in the above-described pressing step, the semiconductor laser chip 2 and the wires 5 are prevented from being crushed by the cover 3B.

As noted before, in the semiconductor laser device A2, the projecting portions 13 are utilized as part of the conduction path to the semiconductor laser chip 2. In the semiconductor laser device A2 having this arrangement, the number of terminals 12b, 12c extending in the y direction and spaced from each other in the x direction can be made smaller than that in the semiconductor laser device A1. As the number of terminals extending in the y direction and spaced from each other in the x direction becomes smaller, the dimension of the semiconductor laser device in the x direction can be made smaller. The size reduction of a semiconductor laser device is desirable for the size reduction of an optical pickup device into which the semiconductor laser device is incorporated.

The semiconductor laser device according to the present invention is not limited to the foregoing embodiments. The specific structure of the semiconductor laser device according to the present invention may be varied in design in various ways. The number of recesses 32, 33 of the paired side walls 31 and the number of projections 35, 36 of the cover 3B are not limited to four. For instance, the main portion 3A or the paired side walls 31 may include a pair of recesses facing each other, whereas the cover 3B may include a pair of projections arranged correspondingly to the recesses. Alternatively, the cover 3B may include a predetermined number of recesses, whereas the main portion 3A or the paired side walls 31 may include a predetermined number of projections arranged correspondingly to the recesses. Alternatively, a cover 3B, which has e.g. a rectangular shape, may be pressed into the main portion 3A or between the paired side walls 31 which do not include any recesses. The semiconductor laser chip 2 is not limited to the structure including two semiconductor laser elements.

The invention claimed is:

1. A semiconductor laser device comprising:
a semiconductor laser element;
a lead including a mount surface for supporting the semiconductor laser element;
a first packaging member including a first wall and a second wall spaced from each other in a first direction that is along the mount surface and crosses a laser beam emission direction of the semiconductor laser element, with the semiconductor laser element arranged between the first and the second walls; and
a second packaging member pressed in between the first and the second walls and facing the mount surface and the semiconductor laser element,
wherein the second packaging member entirely covers the semiconductor laser element as viewed in a second direction that is perpendicular to both the laser beam emission direction and the first direction,
wherein the second packaging member includes a first side surface and a second side surface spaced from each other in the first direction, the first side surface being formed with at least one first projection protruding in the first direction and coming into engagement with the first wall, the second side surface being formed with at least one second projection protruding in the first direction and coming into engagement with the second wall, and
wherein the first projection and the second projection are configured to protrude oppositely to each other and disposed at respective positions overlapping each other as viewed in the first direction.

2. The semiconductor laser device according to claim 1, wherein each of the first and the second walls includes a stopper portion for preventing the second packaging member from approaching the semiconductor laser element.

3. The semiconductor laser device according to claim 1, wherein the second packaging member includes a recess facing the semiconductor laser element.

4. The semiconductor laser device according to claim 1, wherein the first packaging member includes a fitting receiving portion, the fitting receiving portion being defined between a first recess and a second recess, the first recess being formed in a second wall side of the first wall, the second recess being formed in the second wall to face the first recess;
the second packaging member includes a fitting insertion portion, the fitting insertion portion being a portion from the first projection to the second projection, the first projection being formed at a position corresponding to the first recess, the second projection being formed at a position corresponding to the second recess; and
the fitting insertion portion of the second packaging member is pressed into the fitting receiving portion of the first packaging member.

5. The semiconductor laser device according to claim 4, wherein each of the first and the second walls includes a stopper portion for preventing the second packaging member from approaching the semiconductor laser element.

6. The semiconductor laser device according to claim 5, wherein the stopper portion of the first wall is in contact with the first projection, whereas the stopper portion of the second wall is in contact with the second projection.

7. The semiconductor laser device according to claim 1, wherein the first packaging member includes a plurality of fitting receiving portions, each of the fitting receiving portions being defined between a corresponding one of first recesses and a corresponding one of second recesses, the first recesses being formed in a second wall side of the first wall, the second recesses being formed in the second wall to face the first recesses;

the first side surface of the second packaging member is formed with a plurality of the first projections each protruding in the first direction and coming into engagement with the first wall, and the second side surface of the second packaging member is formed with a plurality of the second projections each protruding in the first direction and coming into engagement with the second wall, the first projections corresponding in position to the first recesses, respectively, the second projections corresponding in position to the second recesses, respectively;

the second packaging member includes a plurality of fitting insertion portions, each of the fitting insertion portions being a portion from a corresponding one of the first projections to a corresponding one of the second projections; and each of the fitting insertion portions of the second packaging member is pressed into a corresponding one of the fitting receiving portions of the first packaging member.

8. The semiconductor laser device according to claim 7, wherein part of the first wall is pressed in between adjacent two of the first projections, whereas part of the second wall is pressed in between adjacent two of the second projections.

9. The semiconductor laser device according to claim 7, wherein each of the first and the second walls includes a stopper portion for preventing the second packaging member from approaching the semiconductor laser element.

10. The semiconductor laser device according to claim 9, wherein the stopper portion of the first wall is in contact with the first projections, whereas the stopper portion of the second wall is in contact with the second projections.

11. The semiconductor laser device according to claim 10, wherein the stopper portion of the first wall is in contact with an edge of the second packaging member between adjacent two of the first projections, whereas the stopper portion of the second wall is in contact with an edge of the second packaging member between adjacent two of the second projections.

12. The semiconductor laser device according to claim 1, wherein the first packaging member includes two fitting receiving portions, each of the fitting receiving portions being defined between a corresponding one of two first recesses and a corresponding one of two second recesses, the first recesses being formed in a second wall side of the first wall, the second recesses being formed in the second wall to face the first recess;

the first side surface of the second packaging member is formed with two first projections each protruding in the first direction and coming into engagement with the first wall, and the second side surface of the second packaging member is formed with two second projections each protruding in the first direction and coming into engagement with the second wall, the two first projections corresponding in position to the two first recesses, respectively, the two second projections corresponding in position to the two second recesses, respectively;

the second packaging member includes two fitting insertion portions, each of the fitting insertion portions being a portion from a corresponding one of the first projections to a corresponding one of the second projections;

each of the fitting insertion portions of the second packaging member is pressed into a corresponding one of the fitting receiving portions of the first packaging member;

the first recess of each of the fitting receiving portions includes a first surface held in contact with the first projection to apply a pressing force to the first projection;

the second recess of each of the fitting receiving portions includes a second surface held in contact with the second projection to apply a pressing force to the second projection;

the two first surfaces of the first recesses are so inclined that distance between the two first surfaces gradually reduces as proceeding away from the second wall; and the two second surfaces of the second recesses are so inclined that distance between the two second surfaces gradually reduces as proceeding away from the first wall.

13. The semiconductor laser device according to claim 12, wherein part of the first wall is pressed in between the two first projections, whereas part of the second wall is pressed in between the two second projections.

14. The semiconductor laser device according to claim 12, wherein each of the first and the second walls includes a stopper portion for preventing the second packaging member from approaching the semiconductor laser element.

15. The semiconductor laser device according to claim 14, wherein the stopper portion of the first wall is in contact with the first projections, whereas the stopper portion of the second wall is in contact with the second projections.

16. The semiconductor laser device according to claim 15, wherein the stopper portion of the first wall is in contact with an edge of the second packaging member between the two first projections, whereas the stopper portion of the second wall is in contact with an edge of the second packaging member between the two second projections.

17. The semiconductor laser device according to claim 1, wherein the first side surface of the second packaging member includes a first flat portion adjacent to the first projection, the first flat portion being spaced apart from the first wall of the first packaging member, and wherein the second side surface of the second packaging member includes a second flat portion adjacent to the second projection, the second flat portion being spaced apart from the second wall of the first packaging member.

\* \* \* \* \*